(12) United States Patent
Shamouilian et al.

(10) Patent No.: US 6,278,600 B1
(45) Date of Patent: *Aug. 21, 2001

(54) ELECTROSTATIC CHUCK WITH IMPROVED TEMPERATURE CONTROL AND PUNCTURE RESISTANCE

(75) Inventors: Shamouil Shamouilian, San Jose; Arnold Kholodenko, San Francisco; Semyon Kats, San Francisco; Semyon Sherstinsky, San Francisco; Jon Clinton, San Jose; Surinder Bedi, Fremont, all of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,318

(22) Filed: Jan. 13, 1999

Related U.S. Application Data

(63) Continuation-in-part of application No. 09/015,802, filed on Jan. 29, 1998, now Pat. No. 5,986,878, and a continuation-in-part of application No. 08/744,039, filed on Nov. 5, 1996, now Pat. No. 5,885,469, which is a continuation of application No. 08/755,716, filed on Nov. 25, 1996, now Pat. No. 5,729,423, which is a continuation-in-part of application No. 08/381,786, filed on Jan. 31, 1995, now Pat. No. 5,745,331, which is a continuation-in-part of application No. 08/189,562, filed on Jan. 31, 1994, now abandoned.

(51) Int. Cl.$^7$ .................................................. H01G 23/00
(52) U.S. Cl. ............................................................ 361/234
(58) Field of Search ................................... 361/230–235; 279/128

(56) References Cited

U.S. PATENT DOCUMENTS

| 4,184,188 | 1/1980 | Briglia .................................. 361/234 |
| 4,384,918 | 5/1983 | Abe ....................................... 156/643 |
| 4,399,016 | 8/1983 | Tsukada et al. .................. 204/192 R |

(List continued on next page.)

FOREIGN PATENT DOCUMENTS

| 0 171 011 | 2/1986 | (EP) ............................. H01L/21/68 |
| 0 439 000 A1 | 1/1991 | (EP) ............................. H01G/23/00 |
| 0 452 222 | 10/1991 | (EP) ............................. H01G/23/00 |

(List continued on next page.)

OTHER PUBLICATIONS

Klein, Allen J. "Curing Techniques for Composites" *Advanced Composites*, Mar./Apr. 1988, pp. 32–44.

Nakasuji, et al. "Low Voltage and High Speed Operating Electrostatic Wafer Chuck" *J. Vac. Sci. Technol. A.*, vol. 10, No. 6, Nov./Dec. 1992, pp. 3573–3578.

Watanabe et al. "Electrostatic Force and Absorption Current of Alumina Electrostatic Chuck" *Jpn. J. Appi. Phys.*, vol. 31 (1992) Pt. 1, No. 7, pp. 2145–2150.

(List continued on next page.)

*Primary Examiner*—Stephen W. Jackson
(74) *Attorney, Agent, or Firm*—Thomason Moser Patterson

(57) ABSTRACT

Apparatus for supporting a workpiece and method of making same. The apparatus comprises a flex circuit laminated to a contoured support pedestal. The flex circuit includes a reinforced layer to improve puncture resistance of the flex circuit. The top surface of the chuck has a contoured topography that is achieved by machining the upper surface of the pedestal prior to lamination of the flex circuit to the pedestal. The contoured topography improves the flow of backside cooling gas resulting in a more uniform wafer temperature profile.

13 Claims, 3 Drawing Sheets

U.S. PATENT DOCUMENTS

| | | | |
|---|---|---|---|
| 4,432,635 | | 2/1984 | Mayer et al. .................... 355/30 |
| 4,480,284 | | 10/1984 | Tojo et al. ..................... 361/234 |
| 4,502,094 | | 2/1985 | Lewin et al. .................... 361/234 |
| 4,565,601 | | 1/1986 | Kakehi et al. .................. 156/643 |
| 4,645,218 | * | 2/1987 | Ooshio et al. ................... 361/234 |
| 4,665,463 | | 5/1987 | Ward et al. ..................... 361/234 |
| 4,771,730 | | 9/1988 | Tezuka et al. ................... 118/723 |
| 4,778,326 | | 10/1988 | Althouse et al. ................. 414/786 |
| 4,832,781 | | 5/1989 | Mears ........................... 156/234 |
| 4,999,507 | | 3/1991 | Clemens et al. ................ 250/492.2 |
| 5,055,964 | | 10/1991 | Logan et al. .................... 361/234 |
| 5,104,834 | | 4/1992 | Watanabe et al. ................ 501/127 |
| 5,151,845 | * | 9/1992 | Watanabe et al. ................ 361/234 |
| 5,166,856 | | 11/1992 | Liporace et al. ................. 361/233 |
| 5,207,437 | * | 5/1993 | Barnes et al. ................... 361/234 |
| 5,213,349 | | 5/1993 | Elliott .......................... 279/128 |
| 5,255,153 | | 10/1993 | Nozawa et al. .................. 361/234 |
| 5,270,266 | | 12/1993 | Hirano et al. ................... 437/228 |
| 5,275,683 | | 1/1994 | Arami et al. .................... 156/345 |
| 5,280,156 | | 1/1994 | Niori et al. ..................... 219/385 |
| 5,324,053 | | 6/1994 | Kubota et al. ................... 279/128 |
| 5,338,827 | | 8/1994 | Serafini et al. .................. 528/353 |
| 5,376,213 | | 12/1994 | Ueda et al. ..................... 156/345 |
| 5,377,071 | | 12/1994 | Moslehi ......................... 361/234 |
| 5,382,311 | | 1/1995 | Ishikawa et al. ................. 156/345 |
| 5,384,682 | * | 1/1995 | Watanabe et al. ................ 361/234 |
| 5,452,177 | | 9/1995 | Frutiger ......................... 361/234 |
| 5,463,526 | * | 10/1995 | Mundt ........................... 361/234 |
| 5,522,131 | * | 6/1996 | Steger ........................... 361/234 |
| 5,530,616 | | 6/1996 | Kitabayashi et al. .............. 361/234 |
| 5,539,179 | * | 7/1996 | Nozawa et al. .................. 279/128 |
| 5,547,539 | | 8/1996 | Arasawa et al. ................ 156/626.1 |
| 5,560,780 | * | 10/1996 | Wu et al. ....................... 361/234 |
| 5,583,736 | * | 12/1996 | Anderson et al. ................. 361/234 |
| 5,609,720 | | 3/1997 | Lenz et al. .................... 156/643.1 |
| 5,631,803 | * | 5/1997 | Cameron et al. ................. 361/234 |
| 5,645,921 | * | 7/1997 | Matsunaga et al. ............... 279/128 |
| 5,667,622 | | 9/1997 | Hasegawa et al. ................ 156/345 |
| 5,671,116 | | 9/1997 | Husain .......................... 361/234 |
| 5,671,117 | * | 9/1997 | Sherstinsky et al. ............... 361/234 |
| 5,691,876 | * | 11/1997 | Chen et al. ..................... 361/234 |
| 5,708,557 | * | 1/1998 | Feigenbaum et al. .............. 361/234 |
| 5,729,423 | * | 3/1998 | Donde et al. .................... 361/234 |
| 5,745,331 | | 4/1998 | Shamouilian et al. .............. 361/234 |
| 5,748,435 | | 5/1998 | Parkhe .......................... 361/234 |
| 5,885,469 | * | 3/1999 | Kholodenko et al. .............. 216/11 |

FOREIGN PATENT DOCUMENTS

| | | | |
|---|---|---|---|
| 0 473 930 | 3/1992 | (EP) . | |
| 0 439 000 B1 | 4/1994 | (EP) . | |
| 0 635 869 A1 | 1/1995 | (EP) . | |
| 6156842 A | 3/1986 | (JP) . | |
| 63031732 | 2/1988 | (JP) . | |
| 1-251-735 | 10/1989 | (JP) .............. | H01L/21/68 |
| 1-298721 | 12/1989 | (JP) . | |
| 2-27748 | 1/1990 | (JP) .............. | H01L/21/68 |
| 3286834 | 12/1991 | (JP) . | |
| 3286835 | 12/1991 | (JP) . | |
| 4367247 | 12/1992 | (JP) . | |
| 5069489 | 3/1993 | (JP) . | |

OTHER PUBLICATIONS

"Data Sheet—Breathers and Bleeders" Data Sheet from Airtech International, Inc., Carson, California (1993).

"Kapton General Information," Technical Brochure from DuPont de Nemours Company, Wilmington, Deleware (1993).

R/flex 1100 High Temperature Materials, Data Sheet DS20903D, Rogers Corporation, Chandler, Arizona (1993).

IBM Technical Disclosure Bulletin, vol. 31, No. 1, Jun. 1988, pp. 461–464, "Electrostatic Wafer Holder for Wafer Cooling During Reactive Ion Etching".

International Search Report dated Jun. 9, 1995.

International Application Entitled, "Electrostatic Chuck with Conformal Insulator Film", Published under the Patent Cooperation Treaty (PCT) Publication No. WO 95/20838; International Publication dated: Aug. 3, 1995.

U.S. Pat. Application Entitled, "An Electrostatic Chuck Having a Grooved Surface", filed Jul. 20, 1993; Ser.l No. 08/094,640; Inventor: Steger.

U.S. Pat. Application Entitled, "Protective Coating for Dielectric Materials on Wafer Support Used in Integrated Circuit Processing Apparatus and Method of Forming Same" filed Apr. 22, 1993, Ser. No. 08/052,018;Inventors:Wu et al.

U.S. Pat. Application Entitled, "Electrostatic Chuck with Conformal Insulator Film", filed Jan. 31, 1995; Ser. No. 08/381,786; Inventors; Shamoulian et al.

U.S. Pat. Application Entitled, "Electrostatic Chuck" filed Jan. 31, 1994; Ser. No. 08/189,562; Inventors: Shamouilian et al.

* cited by examiner

ELECTROSTATIC CHUCK WITH IMPROVED TEMPERATURE CONTROL AND PUNCTURE RESISTANCE

CROSS-REFERENCE TO RELATED APPLICATIONS

This application is a continuation-in-part of U.S. patent application Ser. No. 08/744,039 now U.S. Pat. No. 5,885,469, filed Nov. 5, 1996, this application is also a continuation-in-part of U.S. patent application Ser. No. 09/015,802 now U.S. Pat. No. 5,986,878, filed Jan. 29, 1998, which is a continuation of U.S. patent application Ser. No. 08/755,716 now U.S. Pat. No. 5,729,423 filed Nov. 25, 1996, now U.S. Pat. No. 5,729,423, which is a continuation-in-part of U.S. patent application Ser. No. 08/381,786, filed on Jan. 31, 1995 now U.S. Pat. No. 5,745,331, which is a continuation-in-part of U.S. patent application Ser. No. 08/189,562, filed Jan. 31, 1994, now abandoned, all of which are hereby incorporated herein by reference.

BACKGROUND OF THE INVENTION

1. Field of the Invention

The invention relates generally to electrostatic chucks for holding a workpiece and, more specifically, to an electrostatic chuck having a flex circuit with improved puncture resistance and a surface topography that promotes heat transfer from a semiconductor wafer to the chuck.

2. Description of the Background Art

Electrostatic chucks are used for holding a workpiece in various applications ranging from holding a sheet of paper in a computer graphics plotter to holding a semiconductor wafer within a semiconductor wafer process chamber. Electrostatic chucks secure a workpiece by creating an electrostatic attractive force between the workpiece and the chuck. A voltage is applied to one or more electrodes in the chuck so as to induce opposite polarity charges in the workpiece and electrodes, respectively. The opposite charges pull the workpiece against the chuck, thereby retaining the workpiece. In semiconductor wafer processing equipment, electrostatic chucks are used for clamping wafers to a support during processing. The support may form both an electrode (in electrostatic chuck applications) and a heat sink. These chucks find use in etching, chemical vapor deposition (CVD), ion implantation, and physical vapor deposition (PVD) applications.

The materials and processes used to process a wafer are extremely temperature sensitive. Should these materials be exposed to excessive temperature fluctuations due to poor heat transfer from the wafer during processing, performance of the wafer processing system may be compromised resulting in wafer damage. To optimally transfer heat between the wafer and a chuck, a very large electrostatic force is used in an attempt to cause the greatest amount of wafer surface to physically contact a support surface of the chuck. However, due to surface roughness of both the wafer and the chuck, small interstitial spaces remain between the chuck and wafer that interfere with optimal heat transfer.

To achieve further cooling of the wafer during processing, an inert gas such as Helium is pumped into the interstitial spaces formed between the wafer and the support surface. This gas acts as a thermal transfer medium from the wafer to the chuck that has better heat transfer characteristics than the vacuum it replaces. The chuck generally has a contoured surface to maximize heat transfer and to prevent the heat transfer gas from escaping into the surrounding low pressure atmosphere (i.e., the reaction chamber). To further enhance the cooling process, the chuck is typically water-cooled via conduits within the support. This cooling technique is known as backside gas cooling.

An electrostatic chuck often has a flex circuit comprised of a conductive material, such as copper, encased in a flexible dielectric material such as polyimide. The flex circuit has a sculptured surface that enhances backside gas cooling by providing specific channels or grooves for conveyance of the heat transfer gas across the entire bottom surface of the wafer and into the interstitial spaces. The flex circuit may be shaped in various configurations such as a flat plate across most of the support surface, as a series of concentric rings or radial arms to disperse the heat transfer gas across the entire bottom surface of the wafer. The sculptured surface of the flex circuit includes contours such as ribs, grooves or channels provided therein to further improve heat transfer gas flow uniformity.

A disadvantage of prior art chucks that utilize a laminated flex circuit with a sculptured surface is that dielectric materials, such as polyimide, typically used in existing flex circuits are likely to puncture after repeated clamping of wafers in a wafer processing system. A puncture in the upper dielectric of a flex circuit of an electrostatic chuck can lead to a short circuit between the chuck electrode and the wafer. When the chuck electrode is energized, such a short circuit produces a large current flowing through the wafer that damages the wafer. Such a short circuit can only be repaired by replacement of the chuck causing stoppage of production and a decline in productivity.

Therefore, there is a need in the art for a semiconductor wafer processing chuck having a contoured flex circuit that is resistant to punctures and a concomitant method of manufacturing same.

SUMMARY OF THE INVENTION

The disadvantages heretofore associated with the prior art are overcome by a puncture resistant electrostatic chuck having a contiguous workpiece support surface with at least one protruded region to support a backside surface of a wafer.

The apparatus comprises a pedestal having a surface with at least one protruded region and a puncture resistant flex circuit disposed above the pedestal surface. The puncture resistant flex circuit comprises a first dielectric layer beneath a conductive layer and a puncture resistant layer above the conductive layer. Preferably, the puncture resistant layer comprises a woven material of aramid fibers. A second dielectric layer above the puncture resistant layer defines the contiguous workpiece support surface.

Additionally, the electrostatic chuck has at least one heat transfer gas port extending through it to the workpiece support surface. The protruded region(s) are arranged so that when chucked, the workpiece does not block the flow of heat transfer gas to the backside of the wafer. As such, the gas uniformly extends to all non-protruded regions of the chuck surface and fills the space between the wafer and the chuck surface.

An inventive method of fabricating an electrostatic chuck that utilizes a puncture resistant flex circuit includes: forming a laminate of a dielectric layer, a puncture resistant layer and a conductive layer, etching an electrode pattern on the conductive layer, then adhering another dielectric layer to the electrode pattern to form a flex circuit, machining a topography into a pedestal surface of the electrostatic chuck and laminating the aforementioned flex circuit to the sculpted (machined) pedestal surface. The topography created by the machining contains protruded regions and non-protruded regions. The flex circuit is adhered to the surface of the pedestal and conforms to the topography thereof. As such, the support surface of the electrostatic chuck contains protruded regions and non-protruded regions, where the total surface of the protruded regions is less than the total surface area of the non-protruded regions.

This invention fulfills the long felt need for puncture resistant apparatus that can efficiently clamp a wafer to an electrostatic chuck and provide improved heat transfer characteristics. Specifically, the puncture resistant layer of the flex circuit protects the electrode from short circuiting to the wafer. This, in turn leads to longer useful chuck life, fewer damaged wafers, less chamber downtime and increased productivity.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
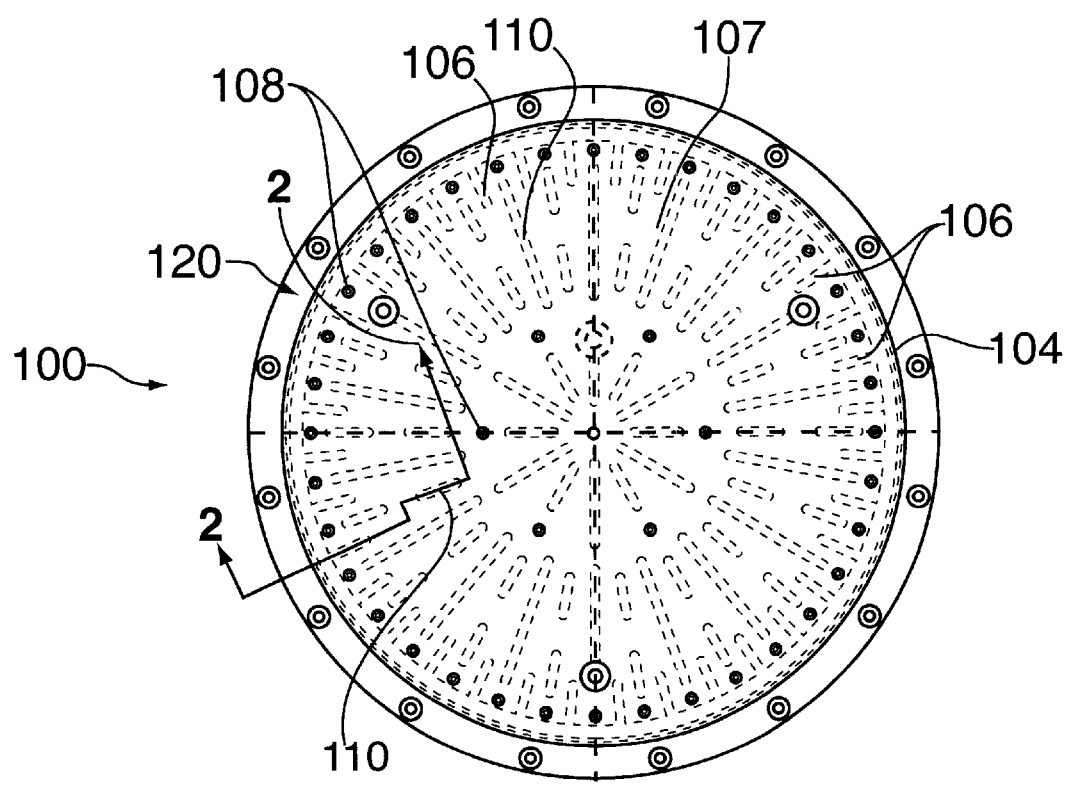
FIG. 1 depicts a top view of an electrostatic chuck with an inventive flex circuit.
Figure 2:
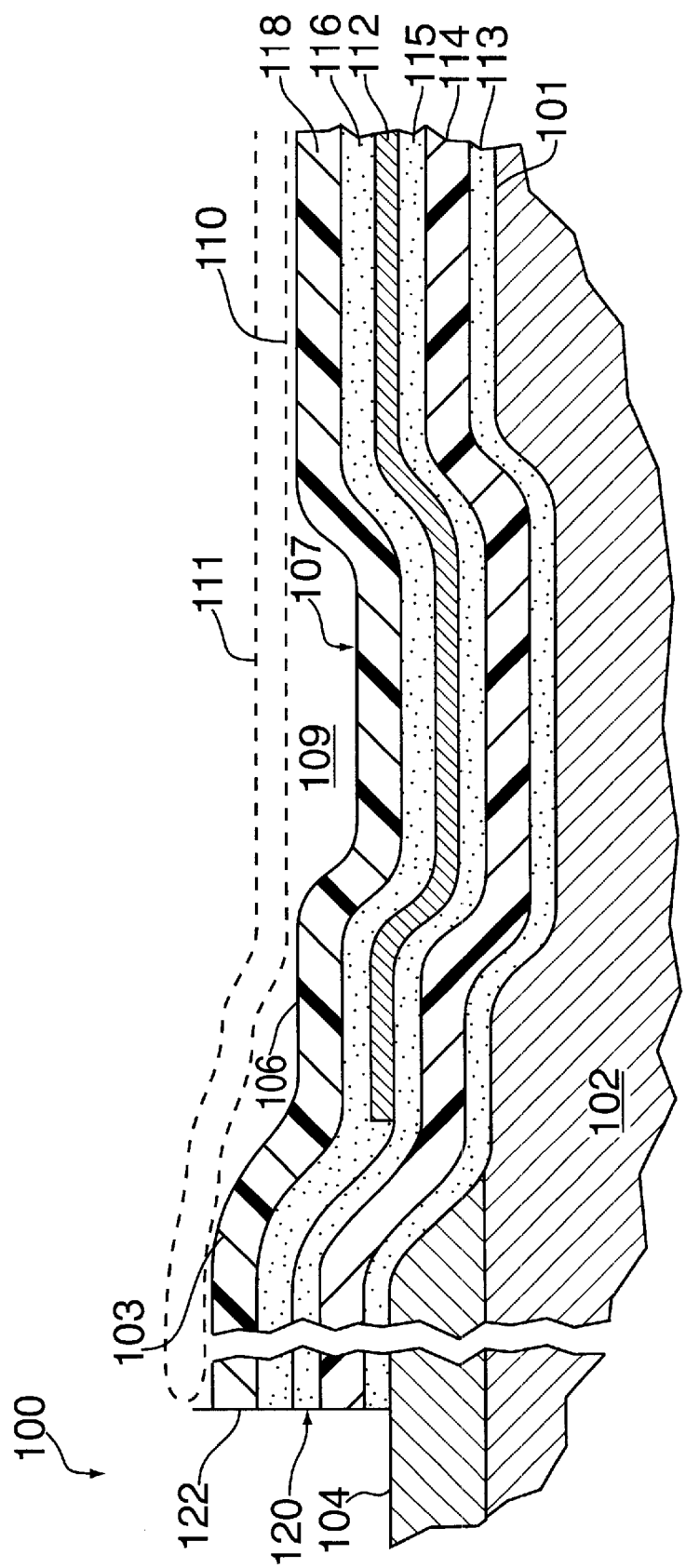
FIG. 2 depicts a cross-sectional view of the electrostatic chuck taken along lines 2—2 of FIG. 1.

FIGS. 1 and 2 depict a top view and a cross-sectional view respectively of an electrostatic chuck 100 adapted to support and electrostatically retain a workpiece to be processed, such as a semiconductor wafer, on a pedestal 102 within a high density plasma reaction chamber (not shown). Specifically, FIG. 2 depicts a cross-sectional view of the electrostatic chuck of FIG. 1 taken along line 2—2 with a semiconductor wafer 111 shown in phantom. To best understand the invention, the reader should simultaneously refer to both FIGS. 1 and 2.

For a detailed understanding of the plasma reaction chamber and its operation in processing a wafer, the reader should refer to the drawings and the detailed description contained in U.S. Pat. No. 4,842,683, issued Jun. 27, 1989 and incorporated herein by reference. That patent discloses a illustrative biased, high density plasma etch reaction chamber manufactured by Applied Materials, Inc. of Santa Clara, Calif.

The electrostatic chuck 100 contains an inventive flex circuit 120 upon which the wafer 111 rests. Specifically, the chuck 100 contains a pedestal 102 with a contoured surface 101 upon which the flex circuit 120 is adhered. The flex circuit contains a first dielectric layer 114, a conductive layer 112, a puncture resistant layer 116 and a second dielectric layer 118.

A laminate containing the second dielectric layer 118, the puncture resistant layer 116 and the conductive layer 112 is assembled as discussed below. The conductive layer 112 is a conductive material such as copper having a uniform thickness of approximately 5 microns. This layer 112 is used to form an electrode for the electrostatic chuck, i.e., the conductive layer is masked and etched to form an electrode pattern. An adhesive layer 115 bonds the conductive layer side of the laminate to the first dielectric layer 114 and the layer 114 is bonded to the pedestal surface 101 by another adhesive layer 113.

The puncture resistant layer 116 protects against puncture by sharp edged fragments that form when a substrate such as the wafer 111, chips during processing. The puncture resistant layer 116 preferably comprises a polymer having a high tensile strength, tenacity, stiffness and fracture toughness. The high stiffness and tenacity results in reduced penetration or puncture of the puncture resistant layer 116 by sharp edged fragments.

A preferred material that provides a high hardness, stiffness, tenacity and toughness values, excellent chemical compatibility, and strong adhesion with polymeric materials is a polyamide material comprising a high molecular weight polymer having hydrocarbon chains containing amide or —CONH— molecular groups. More preferably, the puncture resistant layer comprises highly aromatic polyamides that exhibit increased puncture resistance because of their higher hardness as compared with conventional polyamide materials. The highly aromatic polyamides can be in the form of a continuous planar layer disposed directly above and covering the electrodes or in the form of a layer of intermeshed fibers covering the electrodes. Most preferably, the highly aromatic polyamides comprise aramid materials. The puncture resistant layer can be in the form of a sheet of aramid, or a layer of aramid fibers. The aramid sheet and/or fibers comprise highly aromatic polyamide chains that are preferably oriented parallel to the plane of the sheet, or to the longitudinal axis of the fiber. The highly aromatic molecular chains of aramid provide a hard polymer that exhibits excellent puncture resistance. Preferably, the aramid sheet, or layer of fibers, comprise KEVLAR® or NOMEX® aramid materials fabricated by DuPont de Nemours Company, Wilmington, Del. For example, Kevlar typically has a tensile strength of $400 \times 10^3$ psi, a dry tenacity of 22 g/denier, a percent elongation at break of 2.5%, and a stiffness of 975 g/denier. Nomex has a tensile strength of $90 \times 10^3$ psi, a dry tenacity of 4–5.3 g/denier and a toughness of 0.85 g-cm. Aramid materials are typically derived from phenylenediamine and terepthaloyl chloride.

In the preferred version, the aromatic polyamide layer comprises an intermeshed layer of fibers such as a paper, felt, cloth, or woven structure. It has been discovered that the intermeshed fiber-containing layer provides increased hardness, fracture toughness, and puncture resistance. The fiber-containing layer can be a paper or felt structure comprising non-woven, randomly oriented, short fibers or whiskers which comprise fibers of polyamide embedded in a polymer matrix. When the aromatic polyamide is present in the form of fibers, a surrounding matrix material is used to hold the fibers together. Preferably, the matrix material provides good adhesion and chemical compatibility between the material comprising the conformal holding surface and the aromatic polyamide fibers.

In a preferred configuration, the aramid fibers form a paper or felt structure is easier to fabricate into the chuck because it is easier to cut or laser ablate this randomly oriented structure. Alternatively, the aramid fibers can comprise an oriented woven structure, such as cloth or a weave pattern. A suitable cloth is a "THERMOUNT®" cloth fabricated by DuPont de Nemours Company, Wilmington, Del., having a yarn of 40–60, a denier of 40–60, a fill of 50–60, and a warp of 60–80. While the oriented woven structure is difficult to cut, the woven structure provides more predictable properties in the plane parallel to the fibers, due to the predetermined non-random orientation of the fibers.

In a preferred embodiment of the invention, the puncture resistant layer 116 is Thermount®. Thermount® is a registered trademark of the DuPont Corporation of Wilmington, Del. and is preferred because of its dimensional stability and low weight. Thermount® has a tensile strength of about $80 \times 10^3$ psi, a dry tenacity of about 10 g/denier, and a stiffness of about 10–500 g/denier and a fracture toughness of about 0.79 g-cm. Alternatively, other puncture resistant materials having similar physical characteristics and dielectric properties such as Kevlar may be used for the puncture resistant layer 116.

To form the laminate, the second dielectric layer 118 is placed on top of the puncture resistant layer 116 which is placed on top of the conductive layer 112. The layers are heated and pressed together to form the laminate. Thermount® is an epoxy based material having a Kevlar cloth incorporated within the epoxy resin. Thus, the Thermount® forms an adhesive bond to the conductive layer 112 and the dielectric layer 118 when the layers are heated to between 150 and 175° C. and pressed together using a pressure of 170 to 220 psi. The second dielectric layer 118 has an upper surface that defines a workpiece support surface 107.

The dielectric layers 114 and 118 are preferably an electrically insulative polymeric material, such as polyimide, polyketon, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber. A preferred material to form the conformal holding surface comprises a layer of polyimide. Polyimide is resilient enough to deform slightly under the electrostatic clamping pressure to provide enhanced heat transfer when a heat transfer fluid is introduced in the space 109 between the substrate 111 and the resilient polyimide layer 118. Polyimide also provides superior temperature resistance and excellent dielectric properties. For example, polyimide has a high dielectric breakdown strength, ranging from 3,000 to 3,500 volts per mil, which allows use of a thin layer that maximizes the electrostatic attractive force. Polyimides are also resistant to temperatures in excess of 100° C., and more preferably in excess of 200° C., allowing use of the chuck for high temperature processes. Preferably, the polymeric material also has a high thermal conductivity so that heat generated in the substrate during processing can dissipate through the chuck, a suitable thermal conductivity being at least about 0.10 Watts/m/° K. Furthermore, the dielectric layers 114 and 118 should be stable at temperatures in excess of 50° C. Preferably, the dielectric material used for the first and second dielectric layers 114 and 118 is a sheet of polyimide sold under the brand name UPILEX®. UPILEX® is a registered trademark of UBE Industries, Ltd. of Yamaguchi, Japan. The preferred thickness of the dielectric layers 114 and 118 is 0.002 inches.

Before attaching the flex circuit 120 to the pedestal 102, the topographical structure of the chuck 100 is enhanced by machining the pedestal surface 101 to create contours, such as one or more ribs 106 and 110. Such an electrostatic chuck is disclosed in U.S. patent application Ser. No. 08/744,039, filed Nov. 5, 1996. The pedestal surface 101 is machined to a specific topographical pattern which allows the flex circuit 120 above it to take the shape of the pattern. Specifically, a rim of approximate height 1 mil and width between 1.5 to 2 mm is shown as a preferred pattern in FIG. 2. The height may be altered depending on the thickness of the flex circuit 120. The width may be altered depending on the desired amount of area of the wafer to be exposed to the backside gas to provide adequate cooling.

As an example of the topography, the pedestal 102 is provided with a raised rim 104 at its outer diameter. The diameter of the rim 104 is approximately equal to a diameter of the wafer to be processed. As such, a circumferential edge 122 of the flex circuit 120 follows a contour of the rim 104 such that the wafer 111 is supported in part by the rim via contact with the circumferential edge 122 of the flex circuit 120. The chuck 100 also contains at least one port 108 for conducting heat transfer gas through the chuck 100 to a bottom surface of the wafer. In a preferred embodiment of the invention, thirty-six (36) ports are equidistantly spaced about the circumferential edge 122, six (6) ports are equidistantly spaced radially inward of the circumferential edge 122 and one (1) port is at the center of the flex circuit 120. When the wafer 111 is placed on the chuck 100, it is supported solely by the rim 104. As such, a volume of space 109 is created below the wafer 111 and above the wafer support surface 107. When power is applied to the electrode (i.e., conductive layer 112), it creates an electrostatic force that draws the wafer toward the wafer support surface 107. This electrostatic force is also known as a clamping force. Since the dielectric material of the flex circuit 120 is semi-pliant, a relatively tight seal is created at the rim to wafer contact area 103. As such, the volume of space 109 between the wafer and the flex circuit covered wafer support surface 107 is sealed from the chamber vacuum when the wafer 111 is clamped to the chuck 100.

To create a topography for the wafer support surface 107 upon which the wafer rests when clamped, the surface 101 of the pedestal 102 is preferably machined into a series of protruded and non-protruded regions such as one or more ribs 106 and 110 rising above a common level. The ribs 106 and 110 may be continuous or broken into radial segments about the pedestal 102. In this manner, the protruded regions of support surface that contact the back of the wafer have an area that is smaller than the area of the non-protruded regions. As such, the backside of the wafer is mostly contacted by the heat transfer medium, e.g., argon or helium gas.

Figure 3A:
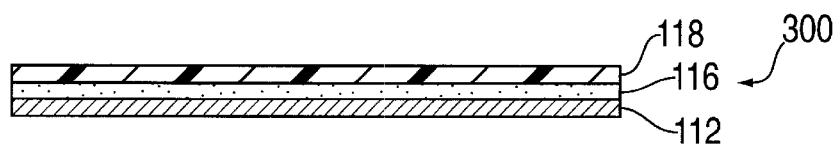
FIGS. 3A–3E are sectional schematic side views showing successive steps in fabrication of an embodiment of the electrostatic chuck of the present invention.
Figure 3B:
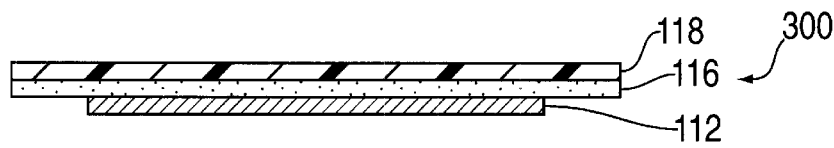
Figure 3C:
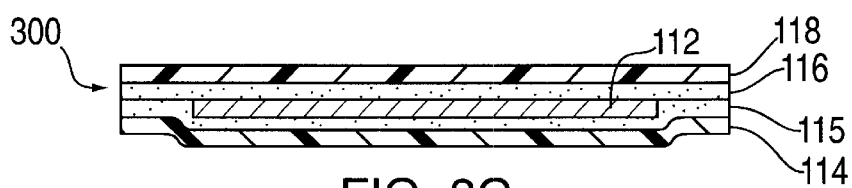
Figure 3D:
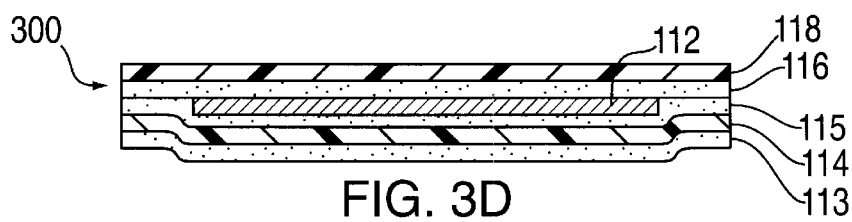
Figure 3E:
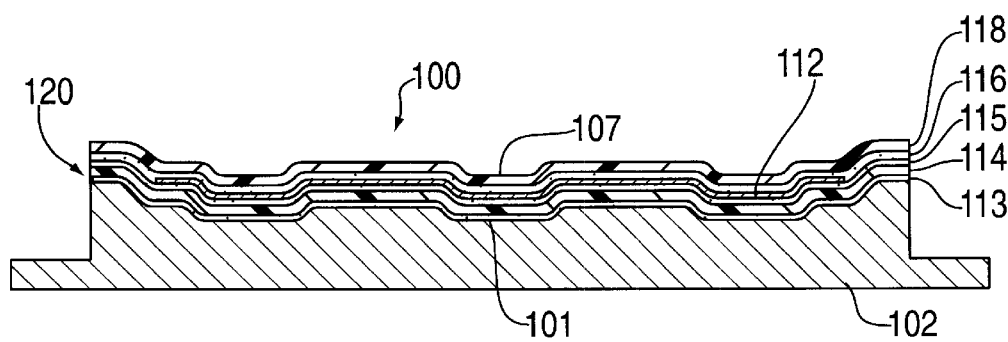

FIGS. 3A–3E depict the steps used to form the flex circuit 120 and adhere the circuit 120 to the pedestal 102. The process starts with a pre-fabricated laminate 300 of the dielectric layer 110, the puncture resistant layer 116 and the conductive layer 112. The laminate is fabricated by stacking the layers 118, 116 and 112 and heating them under pressure (e.g., heating to 165° C. under 200 psi) such that the epoxy in the puncture resistant layer 116 bonds to the dielectric layer 118 and the conductive layer 112. As shown in FIG. 3B, the conductive layer is masked and etched to form the electrode structure. A conventional copper photoresist and wet etching process is used. In FIG. 3C, an adhesive layer 115 is applied between the electrode side of the laminate 300 and the first dielectric layer 114 is applied to the adhesive. Suitable adhesives include, for example, acrylics such as methacrylate, polyesters, polyamide, polyurethanes, epoxies, silicone containing adhesives, and mixtures thereof. The flex circuit 120 is completed by compressing the circuit at a pressure of between 170 and 220 psi and a temperature of between 150 and 175° C. for a period of between 60 and 90 minutes.

Suitable pressure forming apparatus include autoclaves, platen presses or isostatic presses. An autoclave is preferred because autoclaves apply a more uniform pressure on the flex circuit assembly. Typical autoclaves comprise pressure resistant steel chambers having diameters ranging from about 1 to 10 feet. A pressurized nonreactive gas such as carbon dioxide or nitrogen is used to pressurize the autoclave. Suitable autoclaves include those fabricated by "BARON AUTOCLAVES," Santa Fe Springs, Calif.; "AOV INDUSTRIES" in Anaheim, Calif.; and "MELCO STEEL," in Azusa, Calif. Instead of using an autoclave, a platen press or isostatic press can also be used to complete the flex circuit 120. When a platen press is used (not shown), a pressure-distribution sheet such as a silicone or stainless steel plate, is placed on the electrically insulator film to uniformly distribute the platen pressure across the flex circuit. Isotatic presses are used by placing the flex circuit in a suitable isostatic molding bag, and applying a sufficient pressure on the bag using the isostatic press.

After the flex circuit 120 has been formed, it is laminated the pedestal surface 101. For example, in FIG. 3D, a second adhesive layer 115 is applied to the pedestal surface 101, and in FIG. 3E, the flex circuit 120 is pressed against the pedestal surface 101 at a pressure of approximately 2,000 psi and a temperature of approximately 163° C. The second adhesive is generally the same adhesive as the first adhesive. The flex circuit 120 is pressed against the pedestal surface 101 for approximately 60 minutes or until the second adhesive layer 115 sets. Since the puncture resistant layer 116 has already been cured, it will not flow under the heat and pressure of the laminating process. However, the puncture resistant layer is still flexible and, therefore, will conform to the topography machined onto the pedestal surface 101. The flex circuit can be laminated to the pedestal surface using a press such as an autoclave platen press or isostatic press.

The result is a topography across the wafer support surface 107 that lends additional support to the clamped wafer 111. Specifically, the wafer 111 (of FIG. 2) is supported at the outer diameter rim contact area 103 and at least one other point radially inward therefrom (e.g., ribs 106 and 110). The contoured workpiece support surface 107 thus formed is contiguous (i.e., not cut to form channels or grooves).

To achieve cooling of the wafer during processing, a heat transfer gas, preferably Helium, is pumped into the volume 109 between the backside of the wafer 111 and the wafer support surface 107 via the heat transfer gas ports 108. With the addition of the ribs 106 and 110, the uncontrolled interstitial spaces between the wafer and the wafer support surface 107 are eliminated. Thus, the surface area of the wafer exposed to the heat transfer gas is greatly increased. This contributes to greater and more uniform gas pressure distribution than experienced by the prior art. As a result, heat transfer from the wafer to the pedestal is uniform. The improved topography is capable of reducing wafer temperature nonuniformity to approximately 5° C. across the wafer.

The wafer support surface may also be formed as a pattern of islands distributed over the wafer support surface 107, a series of concentric circles or segments or a combination of both. The pattern lends additional support to the wafer beyond that provided by the outer diameter rim as well as contributing to the uniform distribution and flow of Helium to all areas of the wafer. For example, if a wafer were placed on a conventional support surface, the wafer may block one or more of the Helium ports because of wafer flexing. The ribs of the present invention can be patterned to maintain the wafer above the ports to avoid blockage and improve gas distribution. However, in keeping with the teachings of the invention, the area of the wafer physically contacting the support surface at the chuck is substantially less than the area of the wafer that is exposed to the heat transfer gas.

Although various embodiments which incorporate the teachings of the present invention have been shown and described in detail herein, those skilled in the art can readily devise many other varied embodiments that still incorporate these teachings.

What is claimed is:

1. Apparatus for retaining a workpiece comprising:
   a pedestal having a pedestal surface with at least one protruded region;
   a flex circuit disposed upon said pedestal, the flex circuit having
      a workpiece support surface conformal with said pedestal surface; and
      a puncture resistant layer conformal with said pedestal surface and said workpiece support surface.

2. The apparatus of claim 1 wherein said flex circuit comprises:
   a first dielectric layer, a conductive layer disposed above said first dielectric layer, the puncture resistant layer disposed above said conductive layer, and a second dielectric layer disposed above said puncture resistant layer.

3. The apparatus of claim 2 wherein said second dielectric layer defines said workpiece support surface.

4. The apparatus of claim 1 wherein said puncture resistant layer comprises a matrix of aramid polyamide fibers.

5. The apparatus of claim 1 wherein the workpiece support surface further comprises:
   protruded regions and non-protruded regions, where a total surface area of said protruded regions is less than a total surface area of said non-protruded regions.

6. The apparatus of claim 2 further comprising at least one heat transfer gas port extending through the first dielectric layer, the second dielectric layer, the conductive layer and the puncture resistant layer.

7. An apparatus for retaining a wafer comprising:
   a pedestal having a surface with protruded regions and non-protruded regions; and
   a flex circuit, disposed atop said surface of said pedestal, the flex circuit further comprising a first dielectric layer, an adhesive layer disposed upon the first dielectric layer, a conductive layer disposed upon the second adhesive layer, a puncture resistant layer disposed upon the conductive layer and a second dielectric layer disposed upon the puncture resistant layer wherein said flex circuit conforms to the pedestal surface to provide a workpiece support surface having protruded regions and non-protruded regions.

8. The apparatus of claim 7 wherein the puncture resistant layer comprises a matrix of aramid polyamide fibers.

9. The apparatus of claim 7 further comprising at least one heat transfer gas port extending through the first and second dielectric layers, the conductive layer and the puncture resistant layer.

10. A method of fabricating an electrostatic chuck with a contoured surface comprising the steps of:
   (a) providing a laminate containing a conductive layer, a first dielectric layer, and a puncture resistant layer;
   (b) etching the conductive layer to form an electrode pattern;
   (c) adhering a second dielectric layer to the conductive layer to form a flex circuit; and (d) adhering said second dielectric layer of said flex circuit to a pedestal surface having at least one protruded region.

11. The method of claim 10 wherein said puncture resistant layer comprises a matrix of aramid polyamide fibers.

12. The method of claim 10 wherein said first and second dielectric materials are fabricated of polyimide.

13. The method of claim 10 further comprising the step of machining the pedestal surface to form said at least one protruded region prior to adhering the flex circuit to the pedestal surface.

* * * * *